(12) United States Patent  
Pavier

(10) Patent No.: US 8,026,580 B2
(45) Date of Patent: *Sep. 27, 2011

(54) SEMICONDUCTOR DEVICE PACKAGE WITH INTEGRATED HEAT SPREADER

(75) Inventor: Mark Pavier, Felbridge (GB)

(73) Assignee: International Rectifier Corporation, El Segundo, CA (US)

( * ) Notice: Subject to any disclaimer, the term of this patent is extended or adjusted under 35 U.S.C. 154(b) by 449 days.

This patent is subject to a terminal disclaimer.

(21) Appl. No.: 11/590,942

(22) Filed: Nov. 1, 2006

(65) Prior Publication Data

US 2007/0096299 A1 May 3, 2007

Related U.S. Application Data

(60) Provisional application No. 60/732,626, filed on Nov. 2, 2005.

(51) Int. Cl.
*H01L 23/495* (2006.01)
(52) U.S. Cl. . 257/675; 257/676; 257/706; 257/E33.066; 438/123; 438/122; 438/125

(58) Field of Classification Search ............ 257/687, 257/676, 675
See application file for complete search history.

(56) References Cited

U.S. PATENT DOCUMENTS

| 6,590,281 | B2 | 7/2003 | Wu et al. | |
|---|---|---|---|---|
| 6,597,059 | B1 * | 7/2003 | McCann et al. | 257/673 |
| 6,906,416 | B2 | 6/2005 | Karnezos | |
| 7,323,769 | B2 * | 1/2008 | Tan et al. | 257/684 |
| 2002/0135059 | A1 * | 9/2002 | Ou | 257/690 |

OTHER PUBLICATIONS

International Search Report issued in PCT Application No. PCT/US06/42817 on Jan. 28, 2008.

* cited by examiner

*Primary Examiner* — Ajay K Arora
(74) *Attorney, Agent, or Firm* — Farjami & Farjami LLP

(57) ABSTRACT

A multi chip housing has a lead frame to which plural die are soldered. A heat spreader conductive cap encloses a volume containing the plural die or chips and is fixed to the periphery of the lead frame. The tops of the die are closely spaced from the interior of the cap and the volume is filled with a thermally conductive, electrically insulating plastic encapsulant.

20 Claims, 2 Drawing Sheets

SEMICONDUCTOR DEVICE PACKAGE WITH INTEGRATED HEAT SPREADER

RELATED APPLICATIONS

This application claims the benefit of U.S. Provisional Application No. 60/732,626, filed Nov. 2, 2005, the entire disclosure of which is incorporated by reference herein.

FIELD OF THE INVENTION

This invention relates to semiconductor devices and more specifically relates to a novel package for plural chips or die with improved cooling of the chip or die.

BACKGROUND OF THE INVENTION

Packages for 2 or more semiconductor die are well known. Thus it is desirable to provide packages with two or more interconnected MOSFETs as for a buck converter circuit or a general half bridge circuit, or to provide one or more MOSFETs, or IGBTs or the like with an IC controller chip in the same package.

The cooling of such packages is a critical problem. It would be desirable to cool the die in such packages from both surfaces, while also permitting economical manufacture and assembly of such packages.

BRIEF DESCRIPTION OF THE INVENTION

In accordance with the invention, a heat spreader clip is integrated into the multichip package to allow for dual sided cooling for semiconductor die carried on a lead frame. The clip is soldered or otherwise secured to the lead frame and the volume between the lead frame and clip is filled with a thermally conductive, electrically insulative encapsulant. The surface of the clip is closely spaced from the die but is electrically insulated therefrom. The novel structure permits simple, well known, low cost assembly techniques. If desired, passive components such as capacitors, resistors and inductors can be mounted within the enclosed package.

DETAILED DESCRIPTION OF THE PREFERRED EMBODIMENT

Figure 1:
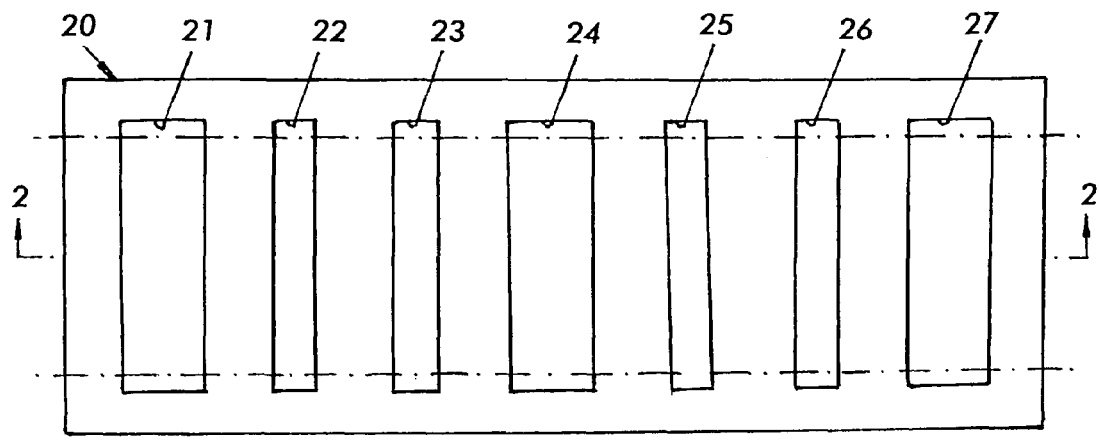
FIG. 1 is a plan view of a lead frame used in connection with the package of the invention.
Figure 2:
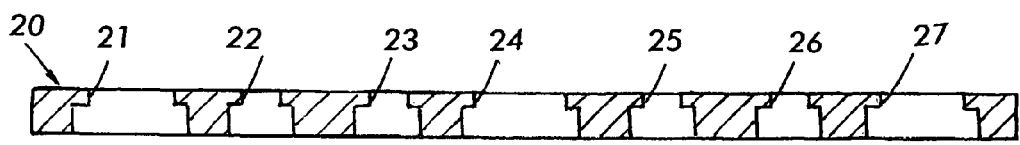
FIG. 2 is a cross-section of FIG. 1 taken across section line 2-2 in FIG. 1.

FIGS. 1 and 2 show a conductive lead frame 20 of conventional material and which may be stamped or etched as shown. Thus, elongated windows 21, 22, 23, 24, 25, 26, 27 are etched or stamped as shown leaving conductive webs between laterally adjacent windows. Any desired number of windows of any desired shape can be used.

Figure 4:
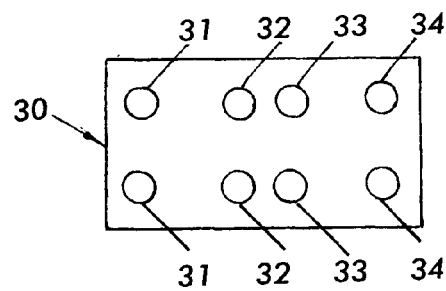
FIG. 4 is a plan view of the die of FIG. 3 as seen from section line 4-4 in FIG. 3.
Figure 3:
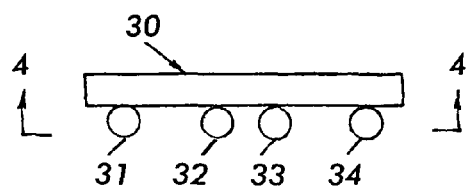
FIG. 3 is a side view of a typical die with solder bump electrodes which can be mounted with other such die in the package of the invention.

FIGS. 3 and 4 show a typical semiconductor die 30 which can be mounted with similar or diverse die in the package of the invention. Die 30 can, for example, be a power MOSFET of any thickness, for example, 50 microns, with conventional solder bump contacts which may have a high lead content or could be of an SAC alloy. The bump material can be of any desired choice. Any desired pattern can be used, governed by the geometry of the webs between windows 21 through 27 in lead frame 20.

While bump contacts are shown, it will be understood that any other contact structure and placement can be employed without departing from the invention and, for example, planar solderable electrodes can be used. Further, the invention is not limited to use with MOSFETs. Other die, including IGBTs, control integrated circuits and the like may be contained, in various combinations, in the novel package of the invention.

Figure 5:
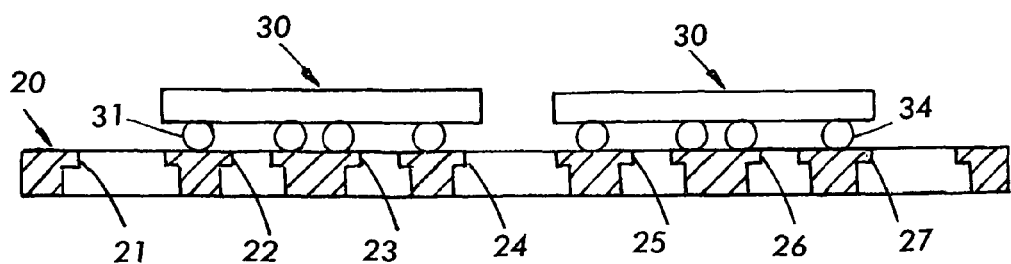
FIG. 5 shows the mounting of two die which may be of the type shown in FIGS. 3 and 4 on the lead frame of FIGS. 1 and 2.

FIG. 5 shows 2 MOSFETs 30 of the type shown in FIGS. 3 and 4 soldered to the webs of the lead frame 20 by any well known process. Note again that other semiconductor die can be used in place of one or both of MOSFETs 30 or in addition thereto by securement to additional lead frame webs or to webs of greater width than that shown so that 2 or more die can be located side by side and interconnected by the conductive web to form some desired circuit connection.

Figure 6:
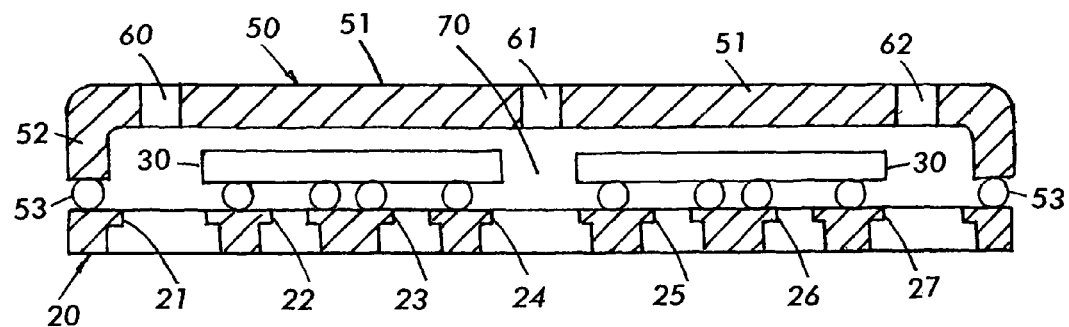
FIG. 6 shows the mounting of a conductive clip on the structure of FIG. 5.

After the die are mounted on the lead frame, and as shown in FIG. 6, a conductive clip or cap 50 is fixed to the lead frame 20. Clip 50 may be of copper and has a flat web portion 51 and a surrounding rim 52. The base of rim 52 may be soldered to the periphery of lead frame 20, as by solder bead 53. Cap 50 has openings 60, 61, 62 which allow subsequent injection of an electrical insulation encapsulant in the cavity 70 formed between cap 50 and lead frame 20. Cap 50 is very closely spaced from the top of die 30 and defines a heat spreader for heat generated by die 30 when the die are energized. By way of example the gap between the bottom of cap 50 and the tops of die 30 may be about 50 microns, but must be large enough to permit flow of insulation plastic into the gap during encapsulation.

Figure 7:
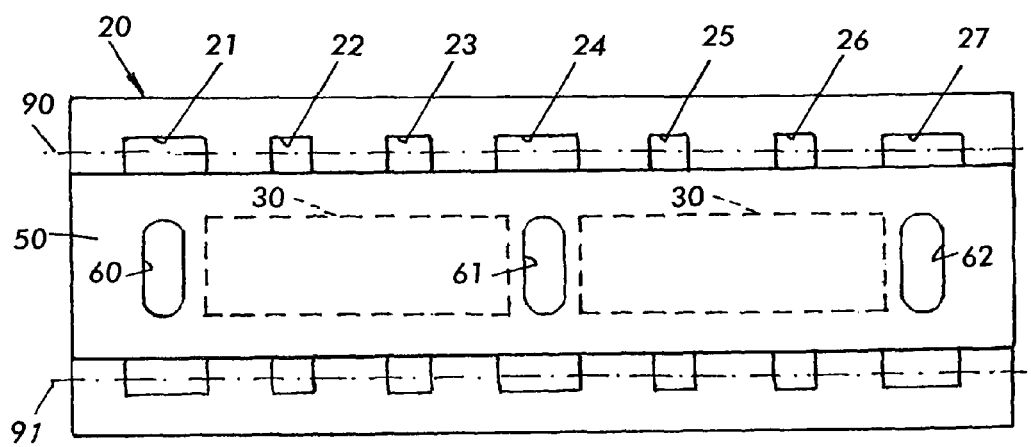
FIG. 7 is a top view of the structure of FIG. 6.
Figure 8:
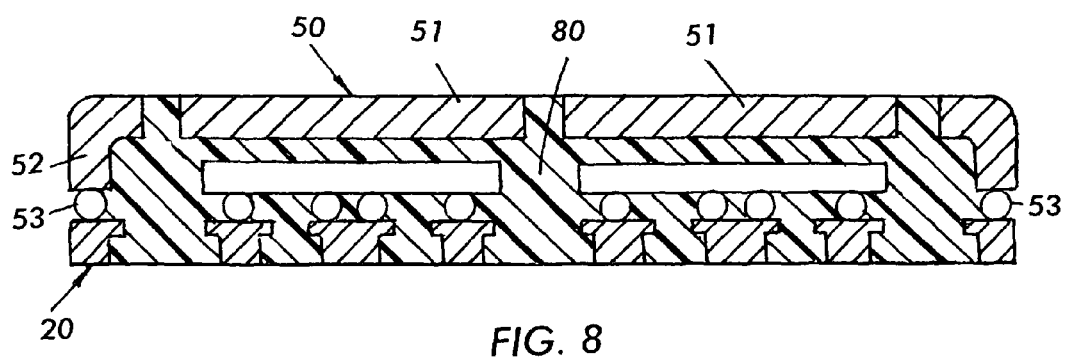
FIG. 8 shows the structure of FIG. 7 after injection of an encapsulant in the volume between the lead frame and conductive clip.

The volume 70 is filled through openings 60, 61, 62 with a suitable thermally conductive but electrically insulative plastic encapsulant 80, as shown in FIG. 8. The lead frame 20 may then be trimmed at trim lines 90 and 91 (FIG. 7). If desired, the web portions may project away from the sides of the package to provide pin connections to the package. Alternatively, the package can be surface mounted by contact from the lead frame web to a suitable circuit board.

In the final package, improved two sided cooling is provided for all die by the lead frame 20 on one side and heat spreader 50 on the other side.

Although the present invention has been described in relation to particular embodiments thereof, many other variations and modifications and other uses will become apparent, to those skilled in the art. It is preferred, therefore, that the present invention be limited not by the specific disclosure herein.

What is claimed is:

1. A semiconductor device package comprising:
a lead frame having a plurality of spaced contact areas;
at least a first and second semiconductor die coplanar with one another and each having at least one contact on one surface thereof, said contact of each of said die being electrically and mechanically connected to a respective one of said plurality of spaced contact areas of said lead frame, the tops of said first and second die being at least approximately coplanar; and a conductive heat spreader fixed to a peripheral area of said lead frame and forming a volume atop said lead frame, which volume contains said at least first and second die, the interior surface of said conductive heat spreader being parallel to said tops of said first and second die and being closely spaced apart from said tops of said first and second die by a gap of said volume, but insulated from said first and second die and permitting effective heat transfer from the die to the heat spreader;

said conductive heat spreader including one or more openings allowing access to an entirety of said volume; and said lead frame and said conductive heat spreader providing two sided cooling for said at least first and second die.

2. The package of claim 1, which further includes a thermally conductive, electrically insulating plastic volume filling said volume.

3. The package of claim 2, wherein said conductive heat spreader has a plurality of openings therethrough for permitting the injection of said plastic into said volume after said heat spreader is fixed to said lead frame.

4. The package of claim 1, wherein at least one of said die is a MOSFET.

5. The package of claim 1, wherein at least one of said die is an integrated circuit and wherein another of said die is a MOSgated device to be controlled by said integrated circuit.

6. The package of claim 1, wherein said conductive heat spreader has a cap shape with a central web having a rim extending therefrom; said rim connected to said lead frame.

7. The package of claim 4, which further includes a thermally conductive, electrically insulating plastic filling said volume.

8. The package of claim 5, which further includes a thermally conductive, electrically insulating plastic filling said volume.

9. The package of claim 6, which further includes a thermally conductive, electrically insulating plastic filling said volume.

10. The package of claim 7, wherein said conductive heat spreader has a plurality of openings therethrough for permitting the injection of said plastic into said volume after said heat spreader is fixed to said lead frame.

11. The package of claim 8, wherein said conductive heat spreader has a plurality of openings therethrough for permitting the injection of said plastic into said volume after said heat spreader is fixed to said lead frame.

12. The package of claim 9, wherein said conductive heat spreader has a plurality of openings therethrough for permitting the injection of said plastic into said volume after said heat spreader is fixed to said lead frame.

13. A semiconductor device package comprising:

a lead frame having a plurality of spaced contact areas;

at least a first and second semiconductor die coplanar with one another and each having at least one contact on one surface thereof, said contact of each of said die being electrically and mechanically connected to a respective one of said plurality of spaced contact areas of said lead frame, the tops of said first and second die being approximately coplanar;

a conductive heat spreader fixed to a peripheral area of said lead frame and forming a volume atop said lead frame, which volume contains said at least first and second die, the interior surface of said conductive heat spreader being parallel to said tops of said first and second die and being closely spaced apart from said tops of said first and second die by a gap of said volume, but insulated from said first and second die and permitting effective heat transfer from the die to the heat spreader;

said conductive heat spreader including one or more openings allowing access to an entirety of said volume; and a thermally conductive but electrically insulating plastic encapsulant substantially filling said entirety of said volume;

said lead frame and said conductive heat spreader providing two sided cooling for said at least first and second die.

14. The package of claim 13, wherein said conductive heat spreader has a plurality of openings therethrough for permitting the injection of said plastic into said volume after said heat spreader is fixed to said lead frame.

15. The package of claim 13, wherein at least one of said die is a MOSFET.

16. The package of claim 13, wherein at least one of said die is an integrated circuit and wherein another of said die is a MOSgated device to be controlled by said integrated circuit.

17. The package of claim 13, wherein said conductive heat spreader has a cap shape with a central web having a rim extending therefrom; said rim connected to said lead frame.

18. The package of claim 13, wherein said lead frame is configured to form a surface mount for said semiconductor device package.

19. The package of claim 13, wherein said lead frame is configured to form pin connections for said semiconductor device package.

20. The package of claim 13, wherein at least one of said contact of said die is a planar solderable electrode.

* * * * *